US010963616B1

(12) United States Patent
Bansal et al.

(10) Patent No.: US 10,963,616 B1
(45) Date of Patent: Mar. 30, 2021

(54) SYSTEMS AND METHODS OF ALIGNING SETS OF WIRES WITH MINIMUM SPACING RULES

(71) Applicant: CADENCE DESIGN SYSTEMS, INC., San Jose, CA (US)

(72) Inventors: Vidhi Bansal, New Delhi (IN); Devendra Deshpande, Utter Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/730,094

(22) Filed: Dec. 30, 2019

(51) Int. Cl.
G06F 30/3953 (2020.01)
G06F 30/3947 (2020.01)
G06F 30/392 (2020.01)
G06F 30/398 (2020.01)

(52) U.S. Cl.
CPC ........ G06F 30/3953 (2020.01); G06F 30/392 (2020.01); G06F 30/398 (2020.01); G06F 30/3947 (2020.01)

(58) Field of Classification Search
CPC .. G06F 30/3953; G06F 30/394; G06F 30/392; G06F 30/398
See application file for complete search history.

(56) References Cited

U.S. PATENT DOCUMENTS

| 8,448,120 | B2* | 5/2013 | Huang | G06F 30/00 716/126 |
| 9,633,987 | B2* | 4/2017 | Smayling | H01L 27/0207 |
| 10,192,021 | B1* | 1/2019 | Raj | G06F 30/392 |
| 10,296,703 | B1* | 5/2019 | Juneja | G06F 30/39 |
| 10,402,534 | B2* | 9/2019 | Huang | G06F 30/394 |
| 2009/0300575 | A1* | 12/2009 | Kornachuk | H01L 23/528 716/50 |
| 2012/0124528 | A1* | 5/2012 | Wang | G06F 30/39 716/52 |
| 2016/0117432 | A1* | 4/2016 | Yuan | G06F 30/398 716/52 |
| 2016/0274455 | A1* | 9/2016 | Wei-De | G03F 1/36 |
| 2019/0065654 | A1* | 2/2019 | Liao | G06F 30/398 |
| 2020/0019670 | A1* | 1/2020 | Chang | G06F 30/394 |
| 2020/0104461 | A1* | 4/2020 | Hu | G03F 1/36 |
| 2020/0134119 | A1* | 4/2020 | Sio | G06F 30/398 |
| 2020/0134122 | A1* | 4/2020 | Huang | G06F 30/398 |
| 2020/0134125 | A1* | 4/2020 | Huang | G06F 30/392 |

* cited by examiner

Primary Examiner — Nha T Nguyen
(74) Attorney, Agent, or Firm — Foley & Lardner LLP

(57) ABSTRACT

Embodiments disclosed herein describe systems, methods, and products for aligning wires in an integrated circuit (IC) design. An illustrative computer may identity multiple references in a first set of wires and multiple targets in a second set of wires in the IC design. The computer may determine reference target pairs from the multiple references and multiple targets. The computer may calculate a path difference for each of the reference target pairs and align the corresponding wires based upon the path difference while obeying minimum spacing rules. The computer may also allow a circuit designer to modify or override the computer selected references, targets, or reference target pairs. Embodiments disclosed herein therefore mitigate the alignment problems of shorting and incorrect spacing.

20 Claims, 13 Drawing Sheets

Reference
102

Target
104

300c

SYSTEMS AND METHODS OF ALIGNING SETS OF WIRES WITH MINIMUM SPACING RULES

TECHNICAL FIELD

This application is generally directed to integrated circuit (IC) design and simulation and more specifically towards systems and methods for aligning a set of wires to another set of wires while obeying minimum spacing rules.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. EDA tools provide various functionality to facilitate different processes for IC design. One of the processes that EDA tools facilitate is the alignment of wires (also referred to as nets) in an IC design.

However, conventional EDA tools enable a restricted wire alignment functionality. For example, a conventional EDA tool allows for alignment of a wire to just a single target. The conventional EDA tool may, for instance, select a single target and provide an alignment of multiple wires to that single target. Such restricted alignment functionality has several technical shortcomings as illustrated in FIGS. 1A-1E.

FIG. 1A shows a conventional alignment of a first set of wires l1, l2, l3, l4 to a second set of wires r1, r2, r3, r4. The first set of wires l1, l2, l3, l4 may form a selection set for selecting a reference 102 (as shown, right edge of l3) for the alignment. A circuit designer may be allowed to select a single target 104 (as shown, left edge of r3), as allowed by a conventional EDA tool. Based upon this selection, the conventional EDA tool sets as the target 104 for all of the wires l1, l2, l3, l4 in the selection set. Therefore, all the wires l1, l2, l3, l4 in the selection move towards the target 104.

For the wire pairs l3, r3, the conventional EDA tool may generate a correct alignment as shown in FIG. 1B. In particular, when l3 stretches towards r3, l3 may properly align with r3 as the target 104 is at the left edge of r3. More specifically l3 may align with r3 while maintaining a minimum spacing 106. However, the target 104 being on the left edge of r3 may generate misalignment between each of wire pairs l1:r1, l2:r2, l4:r4. For example, FIG. 1C shows an alignment process between the wire pairs l4:r4 based upon the target 104 on the left edge of r3. As shown, the reference edge 108 for l4 aligns with the target 104. This alignment causes a short 110 between the wire pairs l4:r4 as a portion of l4 overlaps with a portion r4. As another example of misalignment due to the single target 104, FIG. 1D shows an alignment between wire pairs l2:r2. As shown, the reference edge 112 for l2 aligns with the target 104 and not with r2 thereby generating an incorrect spacing 114 between the wire pairs l2:r2. FIG. 1E shows the misalignments generated based upon a single target 104 selection in the conventional tool. As shown, there is a short 110 between wire pairs l4:r4, an incorrect spacing 114 between the wire pairs l2:r2, and a short 116 between the wire pairs l1:r1.

As such, a significant improvement in wire alignment processes in EDA tools is therefore desired.

SUMMARY

What is therefore are significantly improved EDA tools (also referred to as EDA systems) that generate correct alignment between each wire pair to be aligned while obeying the minimum spacing rules. Embodiments disclosed herein solve the aforementioned technical problems and may provide other technical benefits as well. An illustrative computer may identity multiple references in a first set of wires and multiple targets in a second set of wires forming an integrated circuit (IC) design. The computer may determine reference target pairs from the multiple references and multiple targets. The computer may calculate a path difference for each of the reference target pairs and align the corresponding wires based upon the path difference while obeying minimum spacing rules. The computer may also allow a circuit designer to modify or override the computer selected references, targets, or reference target pairs.

In an embodiment, a computer implemented method comprises identifying, by a computer, a plurality of references in a first set of wires within a portion of an integrated circuit (IC) design; identifying, by the computer, a plurality of targets in a second set of wires within the portion of the IC design; determining, by the computer, a plurality of reference target pairs from the plurality of references and the plurality of the targets; calculating, by the computer, corresponding path differences between the plurality of reference target pairs; and aligning, by the computer, at least a first wire in the first set of wires with at least a second wire in the second set of wires based upon a corresponding path difference.

In another embodiment, a system for aligning wires in an integrated circuit design comprises one or more computers comprising a non-transitory machine-readable media configured to store a database records of first set of wires and a second set of wires forming a portion of an integrated circuit (IC) design; at least one computer of the one or more computers, the at least one computer electrically coupled to the non-transitory machine-readable media and comprising a processor configured to: identify a plurality of references in the first set of wires; identify a plurality of targets in the second set of wires; determine a plurality of reference target pairs from the plurality of references and the plurality of the targets; calculate corresponding path differences between the plurality of reference target pairs; and align at least a first wire in the first set of wires with at least a second wire in the second set of wires based upon a corresponding path difference.

In yet another embodiment, a computer readable non-transitory medium contains one or more computer instructions, which when executed by a processor cause the processor to identify a plurality of references in a first set of wires within a portion of an integrated circuit (IC) design; identify a plurality of targets in a second set of wires within the portion of the IC design; determine a plurality of reference target pairs from the plurality of references and the plurality of the targets; calculate corresponding path differences between the plurality of reference target pairs; and align at least a first wire in the first set of wires with at least a second wire in the second set of wires based upon a corresponding path difference.

BRIEF DESCRIPTION OF THE DRAWINGS

The accompanying drawings constitute a part of this specification and illustrate an embodiment of the subject matter described herein.

DETAILED DESCRIPTION

Figure 1A:
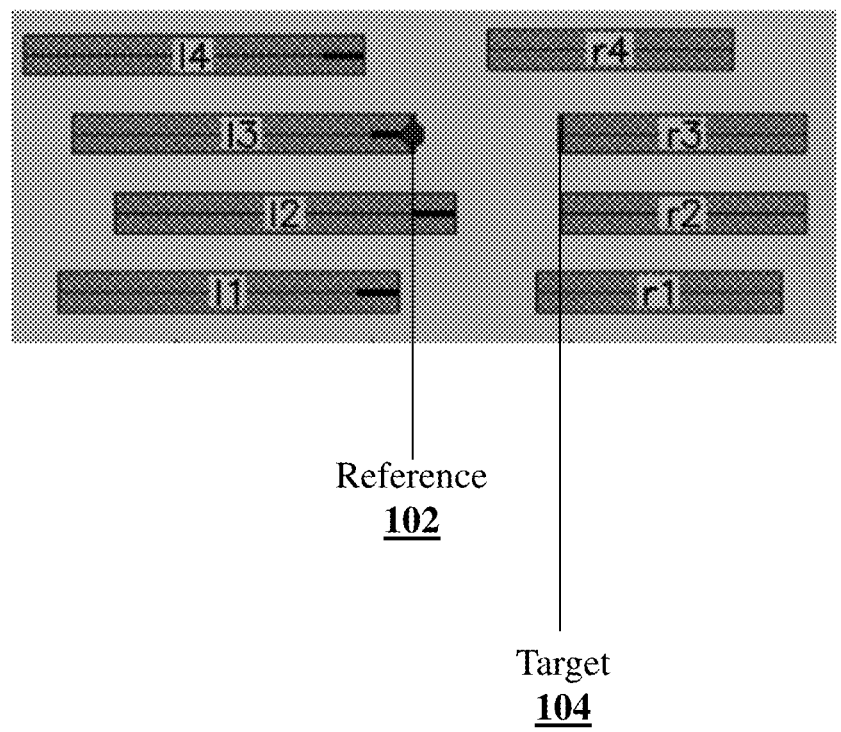
FIGS. 1A-1E show a conventional process of wire alignment.
Figure 1B:
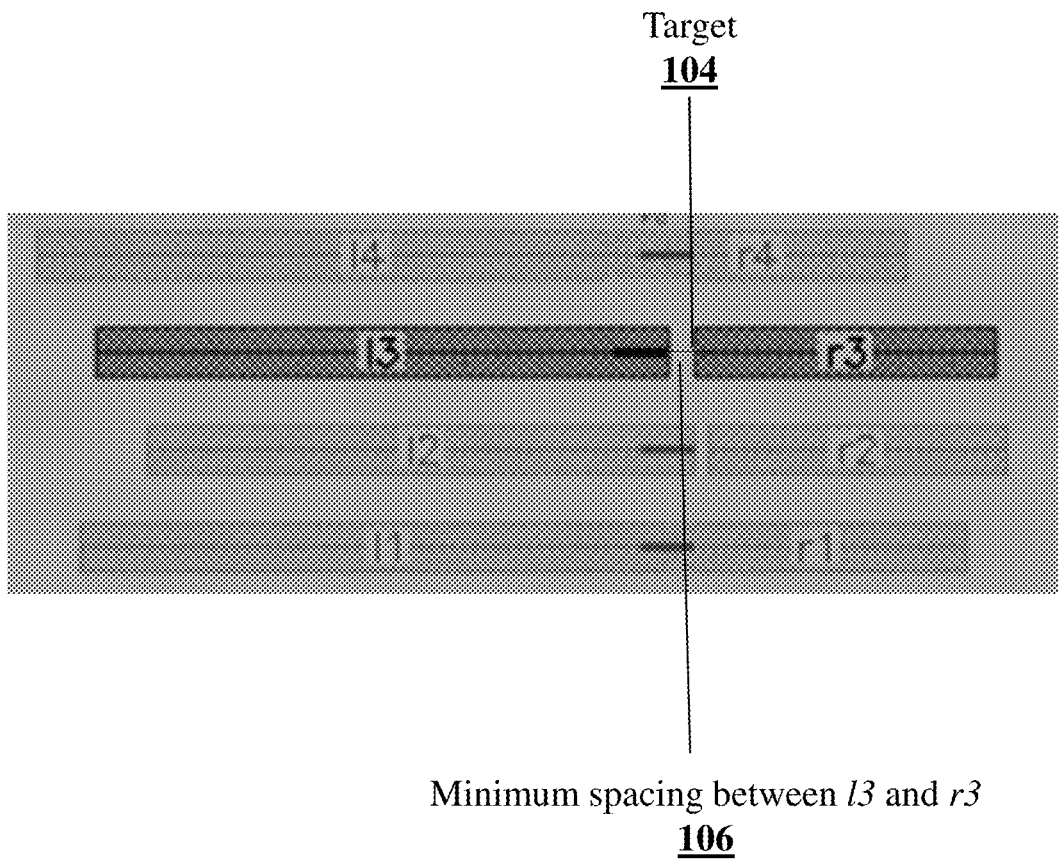
Figure 1C:
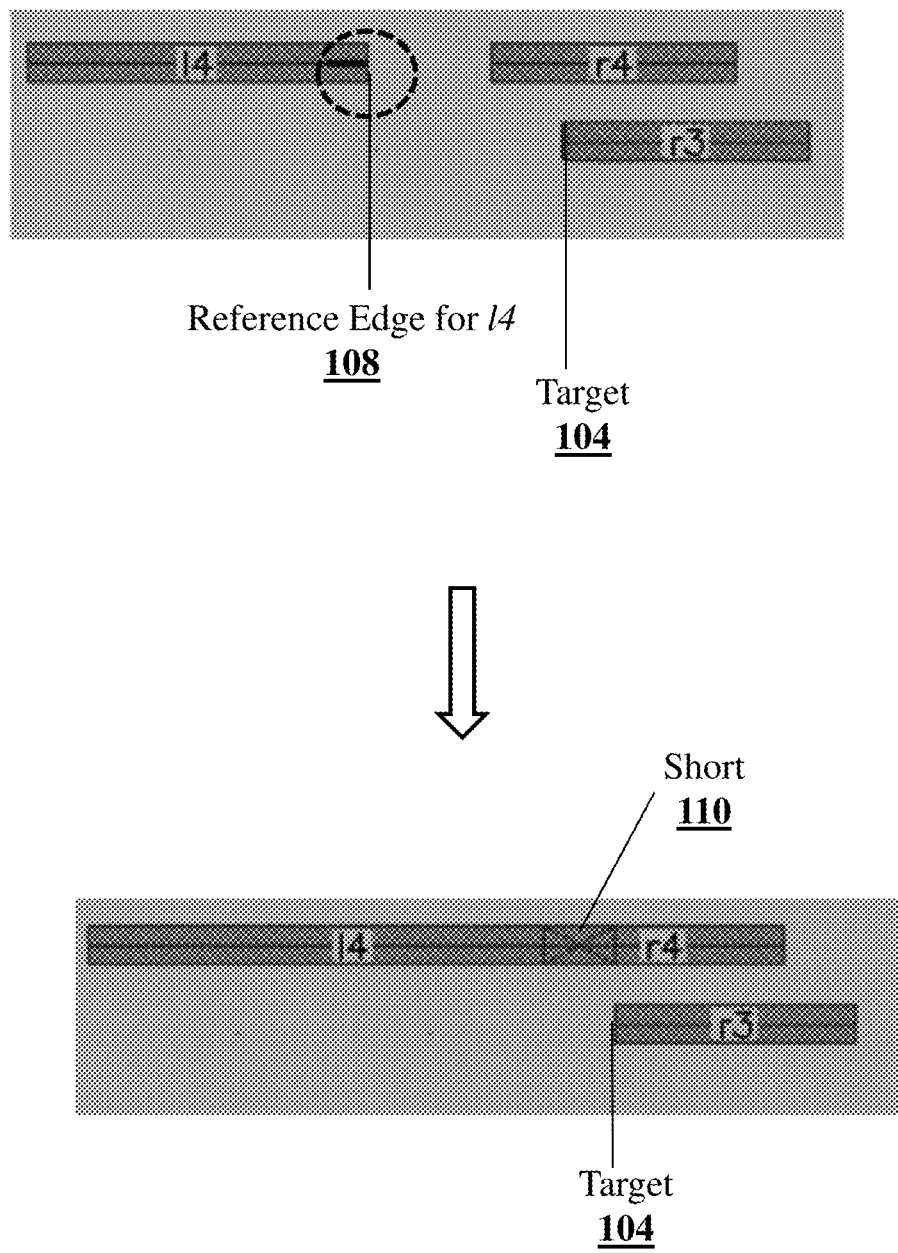
Figure 1D:
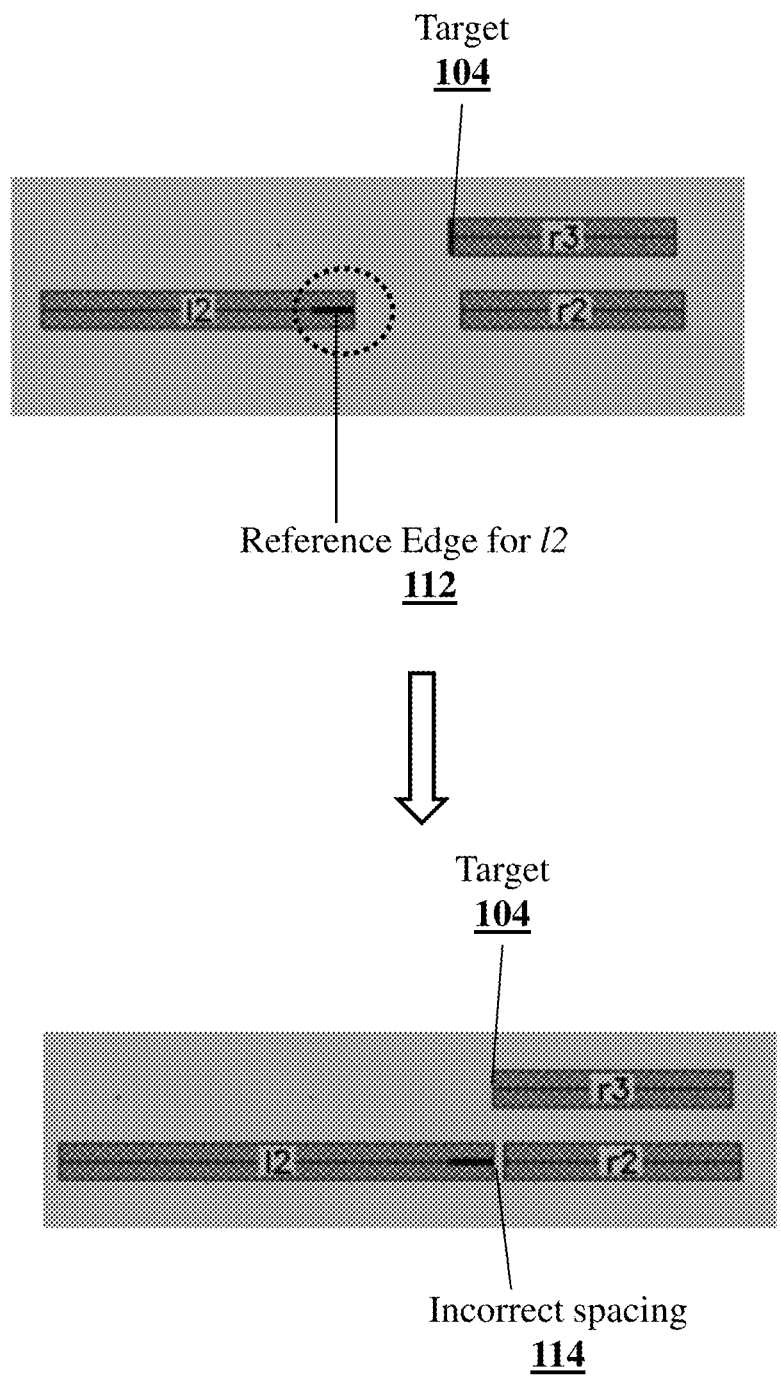
Figure 1E:
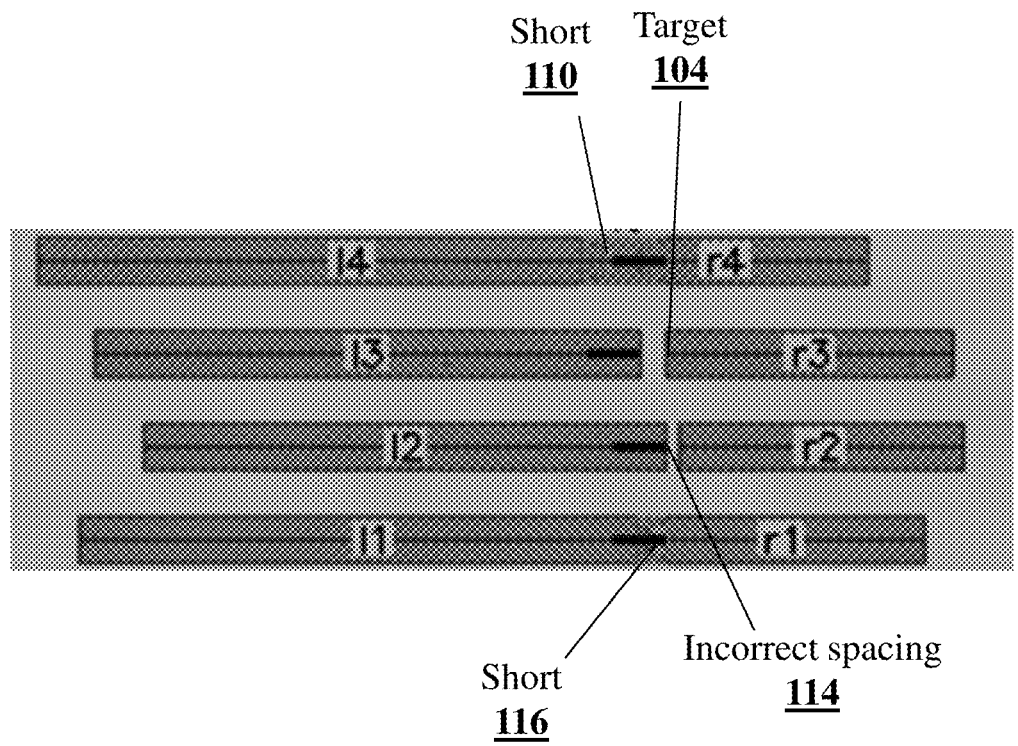

Reference will now be made to the illustrative embodiments illustrated in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one ordinarily skilled in the relevant art and having possession of this disclosure, are to be considered within the scope of the subject matter disclosed herein. The present disclosure is here described in detail with reference to embodiments illustrated in the drawings, which form a part here. Other embodiments may be used and/or other changes may be made without departing from the spirit or scope of the present disclosure. The illustrative embodiments described in the detailed description are not meant to be limiting of the subject matter presented here.

Embodiments disclosed herein describe systems and methods of aligning a first set of wires to a second set of wires in an integrated circuit (IC) design while obeying minimum spacing rules. An illustrative computer, which may be a part of an electronic design automation system, may identify a plurality of references in a first set of wires and a plurality of targets in a second set of wires to be aligned to the first set of wires. The first and second sets of wires may form a portion of the IC design and a circuit designer may provide a single command to align the first and second set of wires. From the plurality of references in the first set of wires and the plurality of targets in the second set of wires, the computer may identity reference target pairs to be aligned and calculate the corresponding distances. The computer may then stretch or move at least a first wire in the first set of wires towards a target in a corresponding second wire in the second set of wires for an alignment between the first and the second wires. The alignment may maintain a predetermined or a user defined minimum spacing between the first and the second wires.

Minimum spacing rules as described herein specify a minimum gap or space between two objects (e.g., wires) when they are aligned. In some instances, the computer may set a minimum spacing based upon an algorithm or an input from the circuit designer. In other instances, there may not be any spacing between the aligned objects (e.g., minimum spacing=0). The computer may provide the circuit designer the flexibility to define and customize spacing rules. For example, the circuit designer may set a customized spacing between the aligned objects. A reference as described herein is an aspect of an object (e.g., an edge of a wire) indicating the direction of the movement or stretching to a second object. A target as described herein is an aspect in the second aspect where the reference aligns to. The alignment therefore may be based upon reference target pairs.

Figure 2:
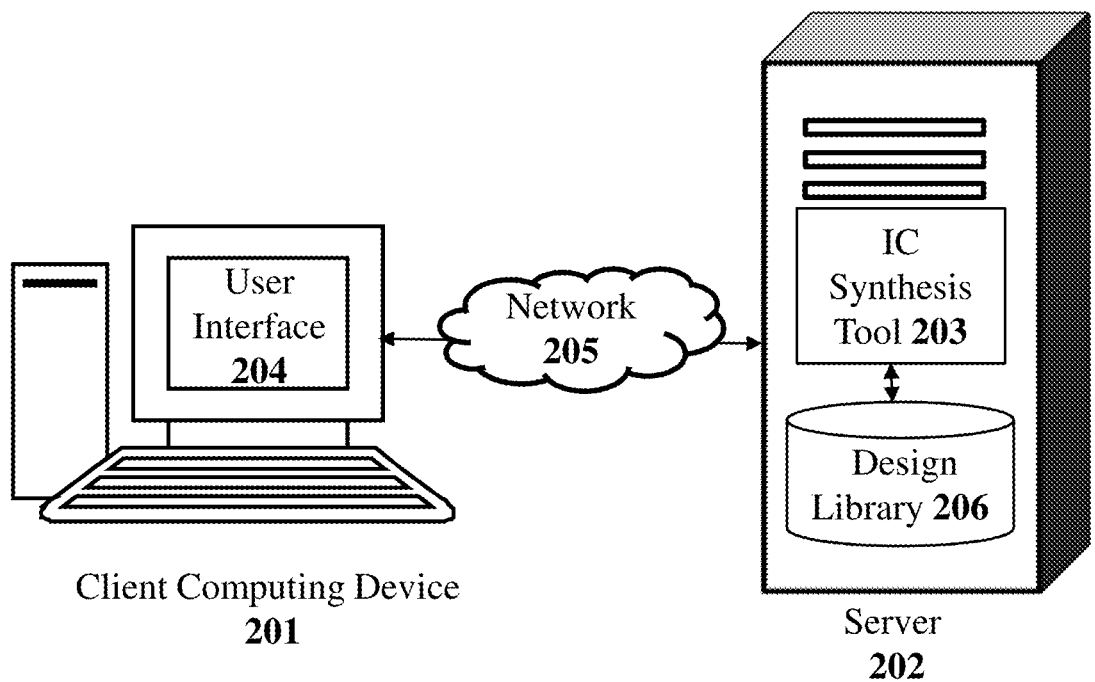
FIG. 2 shows an illustrative electronic design automation system for aligning a first set of wires to a second set of wires while obeying minimum spacing rules, according to an embodiment.

FIG. 2 shows an illustrative electronic design automation (EDA) system 200 for aligning a first set of wires to a second set of wires while obeying minimum spacing rules, according to an embodiment. The EDA system 200 may include any number of computing devices; the illustrative embodiment may include a client computing device 201 and a server 202. One or more components of the electronic design automation system 200 may be grouped and referred to as an electronic design automation tool (or EDA tool). The client computing device 201 may be connected to the server 202 via hardware and software components of one or more networks 205. A network 205 may also connect various computing devices with databases or other components of the system 200. Examples of the network 205 include, but are not limited to, Local Area Network (LAN), Wireless Local Area Network (WLAN), Metropolitan Area Network (MAN), Wide Area Network (WAN), and the Internet. The communication over the network 205 may be performed in accordance with various communication protocols, such as Transmission Control Protocol and Internet Protocol (TCP/IP), User Datagram Protocol (UDP), and IEEE communication protocols.

A client computing device 201 may be any computing device comprising a processor/microcontroller and/or any other electronic component that performs one or more operations according to one or more programming instructions. The examples of the computing device may include, but are not limited to, a desktop computer, a laptop, a personal digital assistant (PDA), a smartphone, a tablet computer, and the like. The client computing device 201 may be configured to communicate with the one or more servers 202 of the system 200 through one or more networks 205, using wired and/or wireless communication capabilities. A user interface 204 in the client computing device 201 may include a Graphical User Interface (GUI) that presents an interactive, graphical representation of an IC design, layout, schematic, or other logical representation of an IC that is being synthesized, designed, optimized, and verified using an IC synthesis tool 203. For example, the GUI 204 may provide an interface for a designer to provide and edit functional specifications of an IC using a hardware description language such as VHDL or Verilog. Furthermore, the GUI 204 may provide interactive elements such as buttons or icons for the user to enter and/or modify the functional specifications written in the hardware description language. The designer may also use the GUI 204 to provide synthesis commands to the system, which may be text based commands or graphical commands such as a click of a button.

As described above, the server 202 may be accessible to the client device 201 via one or more networks 205. The server 202 may be any computing device comprising a processor and other computing hardware configured to execute an IC synthesis tool 203 software module (e.g., EDA synthesis software) that may generate a gate level design from a hardware level description of the design written in, e.g., VHDL or Verilog. In operation, using a client device 201 to access a synthesis tool 203 hosted on a server 202 over a network 205, a circuit designer may interact with the IC synthesis tool 203, through a number of input devices of the client device 201, such as by inputting a selection as with a mouse or inputting a request as with a keyboard. The IC synthesis tool 203 may generate any number of graphical interface 204 responses based on the inputs received from the client device 201, and then send the data back to the client device 201 to be presented on the GUI 204.

The server 202 may include a design library 206 that is accessed by the IC synthesis tool 203. The design library 206 may include instances of various circuit devices used to design an IC. Non-limiting examples of circuit devices may include memory devices (e.g., D flip-flops, T flip-flops, SR flip flops, JK flip flops), combination logic gates (e.g., AND, OR, NOT, NOR, NAND, XOR), wires (also referred to as nets), and multiplexers, among others. In some embodiments, the design library 206 may include instances of pcells used by the IC synthesis tool 203 to generate an IC design. An instance of a pcell may represent electronic circuit components such as a transistor, transmission line, or an optical fiber line. The IC synthesis tool 203 may use instances of pcells or any other types of design instances in the design library 206 to generate a netlist of an IC that can be sent to a manufacturing facility for fabrication.

The illustrative system 200 is shown in FIG. 2 as comprising only one server 202 for ease of explanation. However, it should be appreciated that the system 200 may comprise a number of servers 202. In some embodiments, the system 200 may comprise multiple interconnected, networked servers 202, some of which may execute various software modules configured to manage and control the resources and performance of the system 200. In some embodiments, the servers 202 may have parallel architectures configured to support multi-threading on multi-core workstations to handle large designs. In such embodiments, the servers 202 may be configured for distributed processing. The server 202 may be logically and physically organized within the same or different devices or structures, and may be distributed across any number of physical structures and locations (e.g., cabinets, rooms, buildings, cities). Furthermore, the system 200 with the IC synthesis tool 203 and the design library 206 located at the server 202 is merely for illustration and one or more of the IC synthesis tool 203 and the design library 206 may be within the client computing device 200.

In operation, a circuit designer may provide a align command to align a first set of wires to a second set of wires in the IC design through the user interface 204 in the client computing device 201. In response, the EDA system 200 may identify a plurality of references in the first set of wires and a plurality of targets in the second set of wires. From the plurality of references in the first set of wires and the plurality of targets in the second set of wires, the EDA system 200 may identity reference target pairs to be aligned and calculate the corresponding distances. The EDA system 200 may then stretch or move at least a first wire in the first set of wires towards a target in a corresponding second wire in the second set of wires for an alignment between the first and the second wires. The alignment may maintain a predetermined or a user defined minimum spacing between the first and the second wires. The EDA system 200 may allow the circuit designer to modify or override any of the computer selected references, targets, or reference target pairs through the user interface 204.

Figure 3A:
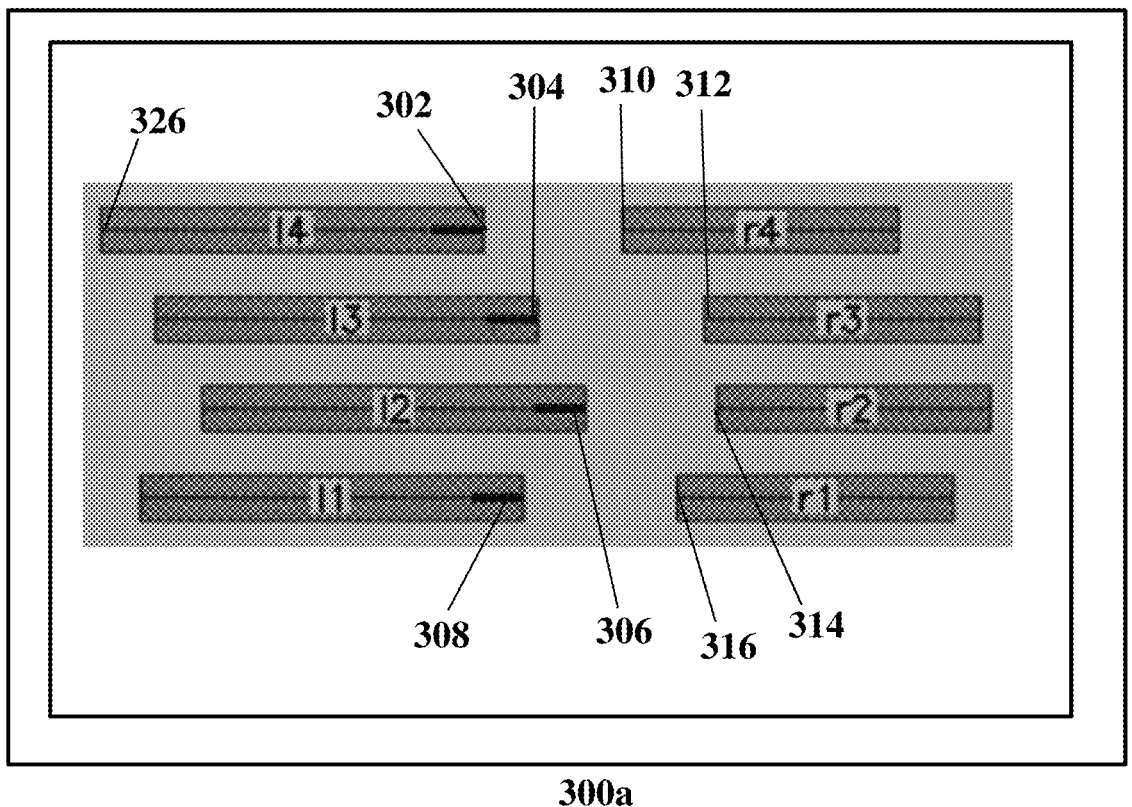
FIGS. 3A-3C show GUIs displaying steps of an illustrative process of aligning a first set of wires with a second set of wires while obeying minimum spacing rules, according to an embodiment.
Figure 3B:
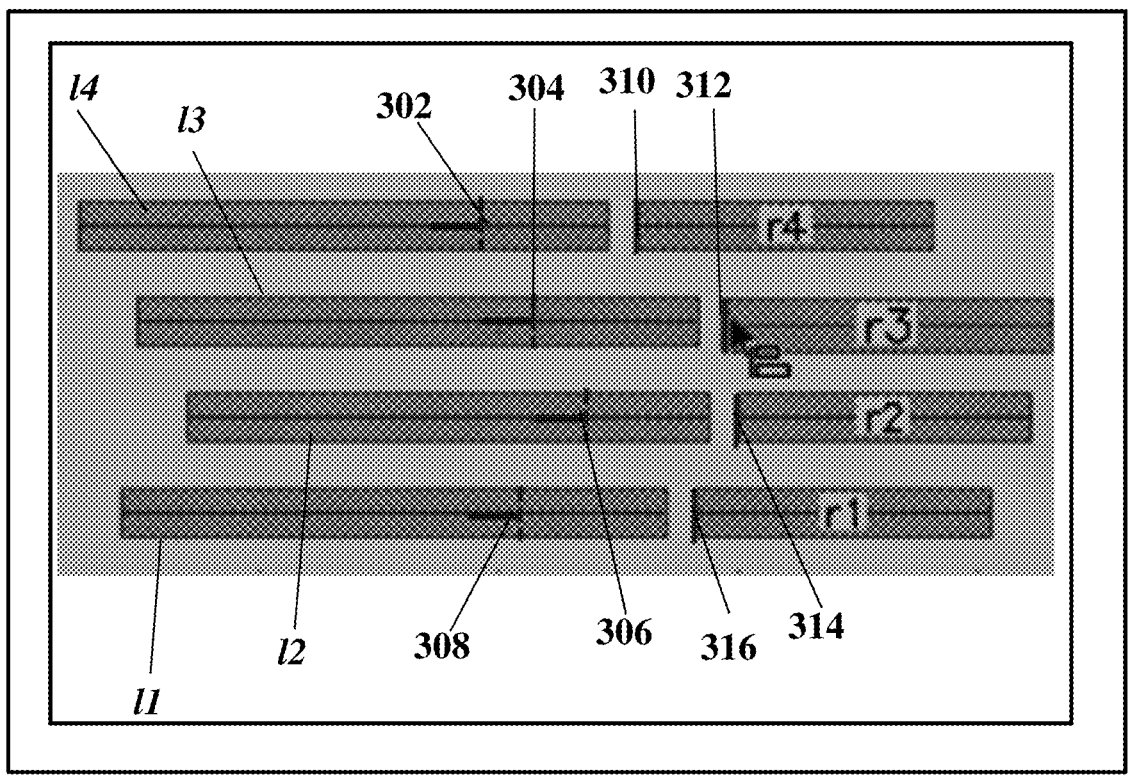
Figure 3C:
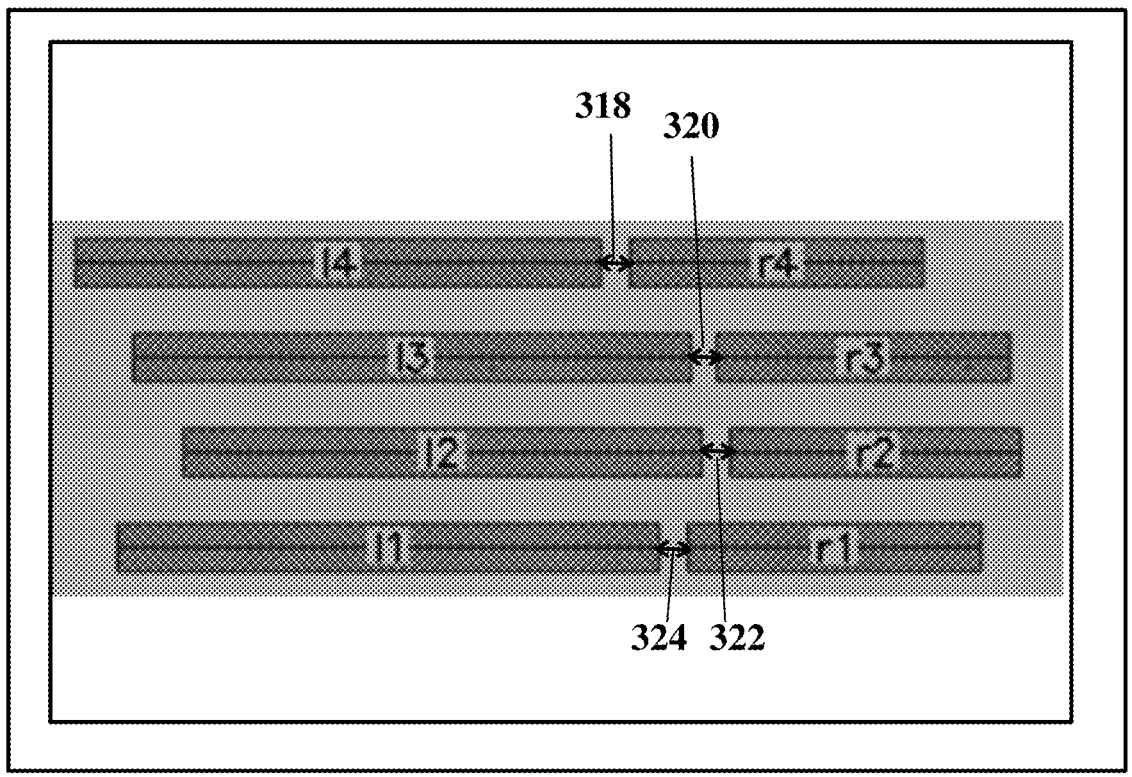

FIGS. 3A-3C show illustrative graphical user interfaces (GUIs) 300a-300c displaying alignments between multiple wire pairs l1:r1, l2:r2, l3:r3, l4:r4, according to an embodiment. In particular, GUIs 300a-300c display illustrative one to one alignments between multiple references 302, 304, 306, 308 and multiple targets 310, 312, 314, 316. It should be understood that the alignment steps displayed by the GUIs 300a-300c are merely for illustration and ease of explanation and other types of alignment steps should be considered within the scope of this disclosure. Furthermore, the wires l1, l2, l3, l4, r1, r2, r3, r4 may be generally referred to as objects and the edges thereon may generally be referred to as aspects.

A computer may generate the GUI 300a displaying a first set of wires l1, l2, l3, l4 to be aligned with a second set of wires r1, r2, r3, r4 in response to receiving an alignment command from a user (also referred to as a circuit designer). The first set of wires l1, l2, l3, l4 may form a selection set, which the computer may have to move or stretch. The computer therefore may have to identify a reference edge or point on each of the first set of wires l1, l2, l3, l4. The user may provide the alignment command through a command line interface displayed by the computer or by selecting a graphical object (e.g., a button on a command pane) on the computer screen. To start the alignment process, the computer may set a reference (e.g., an edge or a point on the edge) on a selected aspect for each of the first set of wires l1, l2, l3, l4. The computer may select the references based upon the direction of alignment, e.g., the references may have to be towards one or more corresponding targets, and/or utilizing other selection algorithms detailed below. As shown, the computer may select reference 302 for wire l4, reference 304 for wire l3, reference 306 for wire l2, and reference 308 for wire l1. As described below further, the circuit designer may override the computer made selection of one or more of the references 302, 304, 306, 308.

As shown, the references 302, 304, 306, 308 may be points or edges of each of the corresponding wires l1, l2, l3, l4. However, it should be understood that a reference for a wire may be point or an edge on another wire. The computer may generally provide the flexibility of selection of reference in the object (e.g., wire) itself or in another object. The computer sets as a reference an already selected aspect (point/edge) of an object. For example, if the aspect 302 (point/edge of the wire l4 on the right side of the wire l4) has already been selected (e.g., for other purposes in the circuit design/simulation process), the computer may select the aspect 302 to set a reference for the wire l4. In other instances, the user may explicitly select the aspect 302 to set a reference for the wire l4. For example, the user may click on the aspect 302 or provide a command line instruction to the computer to select the aspect 302 to set a reference for the wire l4 as a part of the alignment request/command.

In some instances, the user may have selected the entire wire l4 thereby making either edges (or points within the edges) 302, 326 as candidates for a reference for the wire l4. In these instances, the computer may select as a reference the edge matching an identified target. Therefore, for the wire l4, the computer may select as a reference the edge 302 (out of the set containing edges 302, 326) because the edge 302 matches the identified target 310. The reference target matching may be based upon one or more algorithms associated with the alignment command.

In some cases, a wire is fully selected, and the computer may have to identify a reference on the fully selected wire. The fully selected wire may have multiple aspects and, therefore, multiple candidates for a reference. The computer may use an algorithm associated with the alignment command to identify a reference from the multiple candidates. For example, the computer may select as a reference the edge that is closest to the mouse cursor in the GUI 300a. If there are multiple edges roughly the same distant from the mouse cursor, the computer may select the most important edge based upon path characteristics. Path characteristics for a wire may define a width for a wire and/or a movement or stretch direction of the wire. For instance, based upon the path characteristics, each of the wires l1, l2, l3, l4, r1, r2, r3, r4 may have a fixed width and may be able to stretch or move in one direction lengthwise. As a non-limiting example, the wire l4 may only stretch horizontally towards r4 and therefore aspect 302 may be the most important aspect for the wire l4. The computer may display the computer selected references (e.g., references 302, 304, 306, 308) and the user may provide override commands to select references other than the computer selected references. For example, the user may cycle through other aspects and pick one or more of the other aspects as references.

In some embodiments, the user may have selected multiple objects, e.g., all of the wires l1, l2, l3, l4, and the computer may have to identify references for each of the wires l1, l2, l3, l4. The computer may identify targets 310, 312, 314, 316 for each of the wires l1, l2, l3, l4 utilizing an algorithm associated with the alignment command and identify (or select) the references 302, 304, 306, 308 based upon the identified targets. For example, the computer may select an aspect for a wire (out of the multiple selected wires) that is closest to the mouse cursor. For example, aspect 302 of the wire l4 may be closest to the mouse cursor and the computer select aspect 302 as a reference 302 for wire l4. If there are multiple candidates, e.g., multiple aspects being roughly the same distant from the mouse cursor, the computer may select the most important aspect. For example, aspect 302 may be the most important aspect based on the characteristics of the wire l4. Regardless of the modality of selection, once the computer sets the first reference 302, the computer may determine and set the rest of references by aspects of other wires l3, l2, l1 that are parallel or in the same direction as the first reference 302. As shown in FIG. 3A, the computer may set as respective references aspects 304, 306, 308 for the wires l3, l2, l1 as these aspects 304, 306, 308 are in the same direction as the first reference 302.

The computer may display the computer selected references 302, 304, 306, 308 and allow the user to override one or more of the computer selected references 302, 304, 306, 308. The user can select other references by cycling to other aspects (e.g., aspect 326 in the wire l4). If the user selects a non-computer selected aspect as a reference, e.g., by selecting aspect 326 overriding the computer selected aspect 302, the computer may adjust other references 304, 306, 308 based upon the user's selection of the new reference 326. In some embodiments, the computer may allow the user to override all the selected references 302, 304, 306, 308 and keep one references as a single primary reference. Regardless of the modality of selection, the selected references 302, 304, 306, 308 (or any other set of references or a single primary reference) may determine how the set of wires l1, l2, l3, l4 may move, stretch, or copy for alignment.

In addition, the computer may select targets (e.g., for references 302, 304, 306, 308) for each wire in the second set of wires r1, r2, r3, r4. The computer may select the targets based upon the direction of the alignment, e.g., towards the direction of corresponding references 302, 304, 306, 308. As shown, the computer may select target 310 on wire r4 for reference 302 on wire l4, target 312 on wire r3 for reference 304 on wire l3, target 314 on wire r2 for reference 306 on wire l2, target 316 on wire r1 for reference 308 on wire l1. In some instances, the computer may display each of the reference target pairs 302:310, 304:312, 306:314, 308:316 as color coded pairs for easier identification by the circuit designer.

In some instances, the computer may identify and select a target 310 before identifying and selecting the references 302, 304, 306, 308. The number of eventually selected targets 310, 312, 314, 316 can be the same as the number of eventually selected references 302, 304, 306, 308 (as described herein with regard to FIGS. 3A-3C) or fewer than the number of references (as described below in regard to FIGS. 4A-4C). For a single target identification and selection (e.g., target 310), the computer may identify a target with a closest aspect (e.g., edge 310 of the wire r4) from the mouse pointer. The selected target may have a maximum span for the dimensions of other selected objects, e.g., the wires l1, l2, l3, l4 that may have to be stretched, copied, or moved towards the selected target. Furthermore, the computer may select the target on the closest layer purpose pair (LPP) stack, such as the same LPP stack as that of the selected objects that may have to be stretched, copied, or moved towards the selected target. The computer may then display the selected target and the inferred references (based upon a previous selection of the objects) and show a drag preview. Additionally or alternatively, the computer may identify and select pairs of references and targets. For example, the computer may select as a target closest aspect to the mouse pointer that has one of the selections identified as a reference (also referred to as an inferred reference). For instance, the target may be on the same line or within a span in a direction perpendicular to an alignment line from the inferred reference. As another example, the target may be at the closest LPP or the same LPP in the connectivity stack as the inferred reference. The computer may highlight (e.g., through color coding) the identified target and the inferred reference as primary reference-target pair. The computer may then identify other targets matching other selections (e.g., other inferred references) using similar logic. After identifying and selecting the targets for the inferred references, the computer my highlight the reference-target pairs and may display drag or stretch previews. The computer may allow the circuit designer to modify or approve one or more of the highlighted reference-target pairs.

In other instances, the computer may identify and select the targets 310, 312, 314, 316 after identifying and selecting the references 302, 304, 306, 308. For a single target identification and selection, the computer may identify a target that is closest to the mouse pointer and is compatible with the primary reference or any other reference (e.g., reference 302). The identified target may have a maximum span for the dimensions of all the selected wires (e.g., l1, l2, l3, l4) or aspects (e.g., 302, 304, 306, 308). The selected target may have to be on the closest LPP or the same LPP in the connectivity stack as the primary reference or any other reference. After identifying and selecting the target, the computer my highlight the target and may display a drag or stretch preview. The circuit designer may override or approve the computer selected target. Additionally or alternatively, the computer may identify and select pairs of references and targets. For example, the computer may select as a target closest aspect to the mouse pointer that may be compatible with a known primary reference. For instance, the target may be on the same line or within a span in a direction perpendicular to an alignment line from the known primary reference. As another example, the target may be at the closest LPP or the same LPP in the connectivity stack as the known primary reference. The computer may highlight (e.g., through color coding) the identified target and the primary reference as primary reference-target pair. The computer may then identify other targets matching other references using similar logic. After identifying and selecting the targets for the known references, the computer may highlight the reference-target pairs and may display drag or stretch previews. The computer may allow the circuit designer to modify or approve one or more of the highlighted reference-target pairs.

Based upon the selected references 302, 304, 306, 308 and the selected targets 310, 312, 314, 316, the computer may generate an updated GUI 300b. The updated GUI displays an alignment process wherein: (i) wire l4 may stretch from reference 302 towards the target 310 on the wire r4, (ii) wire l3 may stretch from reference 304 towards the target 312 on the wire r3, (iii) wire l2 may stretch from reference 306 towards the target 314 in the wire r2, and (iv) wire l1 may stretch from reference 308 towards the target 316 in the wire r1. The computer may stretch each of the wires l1, l2, l3, l4 based upon a calculated distance (by the computer) between the corresponding references and targets. More specifically, the computer may: (i) stretch wire l4 based upon a calculated distance between reference 302 and the target 310, (ii) stretch wire l3 based upon a calculated distance between reference 304 and the target 312, (iii) stretch wire l2 based upon a calculated distance between reference 306 and the target 314, and (iv) stretch wire l1 based upon a calculated distance between 308 and the target 316. In some instances, the computer may carry over the color coding displayed in GUI 300a to the updated GUI 300b. It should be understood that the stretching of the wires l1, l2, l3, l4 is merely for illustration and any kind of movement towards the corresponding references 310, 312, 314, 316 should be considered within the scope of this disclosure.

The computer may generate an updated GUI 300c as shown in FIG. 3C when the aforementioned alignments are committed by the computer and/or the circuit designer. To commit the alignments, the circuit designer may provide a commit command, e.g., through command line or through a graphical object, and the computer may commit the alignments in response to the commit commands. In some instances, the computer may commit the alignments as a part of executing the align command. Regardless of the modality of receiving the commit command, the computer may generate a final alignment between the wire pairs l1:r1, l2:r2, l3:r3, l4:r4 with minimum spacing between each of these wire pairs. As shown in the updated GUI 300c, wire pair l4:r4 may have a minimum spacing 318, wire pair l3:r3 may have a minimum spacing 320, wire pair l2:r2 may have a minimum spacing 322, and wire pair l1:r1 may have a minimum spacing 324. The minimum spacing rule to maintain each minimum spacing 318, 320, 322, 324 is merely illustrative and other minimum spacing rules should be considered within the scope of this disclosure. In some embodiments, there may be no spacing (e.g., minimum spacing=0) or a user defined spacing.

As shown in the updated GUI 300c, the computer may utilize the embodiments disclosed herein to generate a correct alignment between each of the wire pairs l1:r1, l2:r2, l3:r3, l4:r4 while obeying the minimum spacing rules for each of the wire pairs l1:r1, l2:r2, l3:r3, l4:r4. Unlike the conventional tools, there may not be a short or an incorrect spacing between each of the wire pairs l1:r1, l2:r2, l3:r3, l4:r4.

Figure 4A:
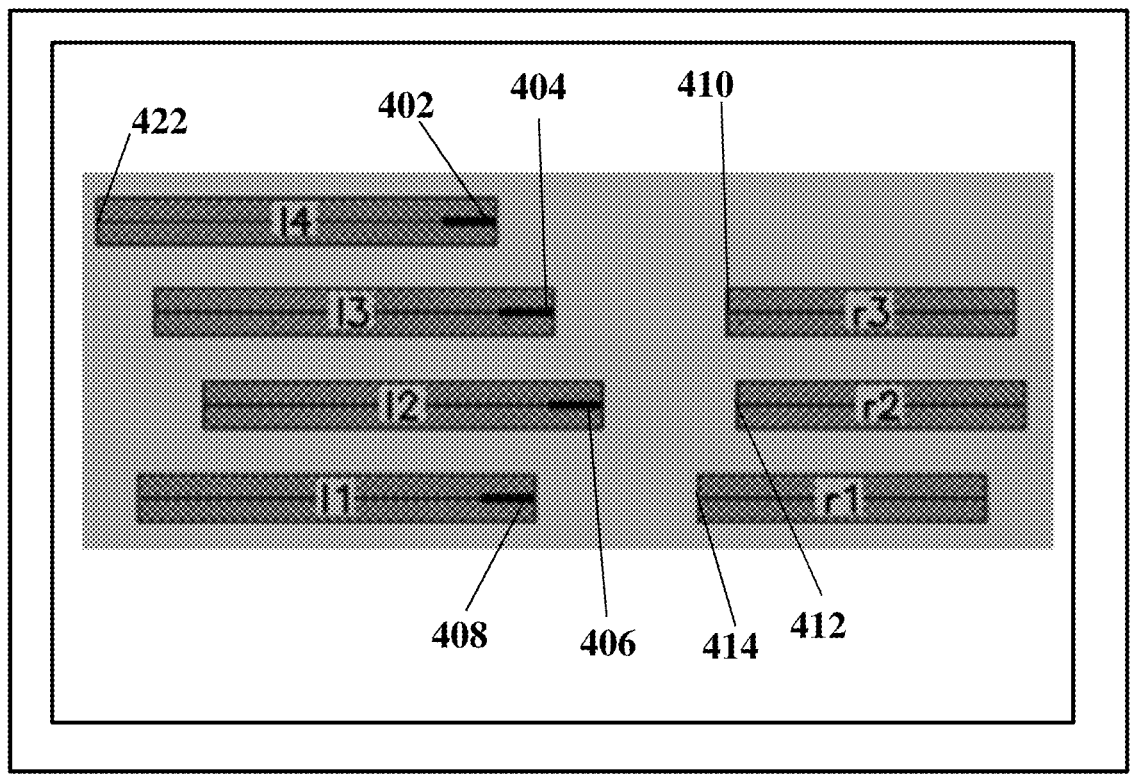
FIGS. 4A-4C show GUIs displaying steps of an illustrative process of aligning a first set of wires with a second set of wires while obeying minimum spacing rules, according to an embodiment.
Figure 4B:
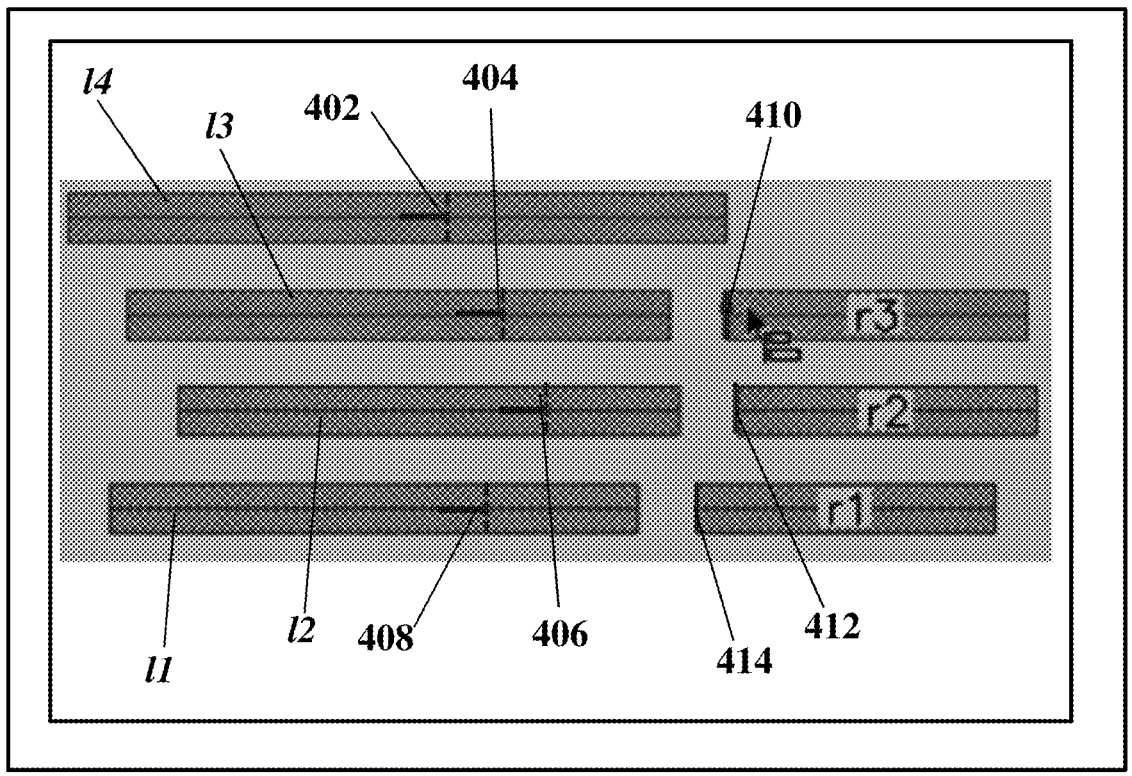
Figure 4C:
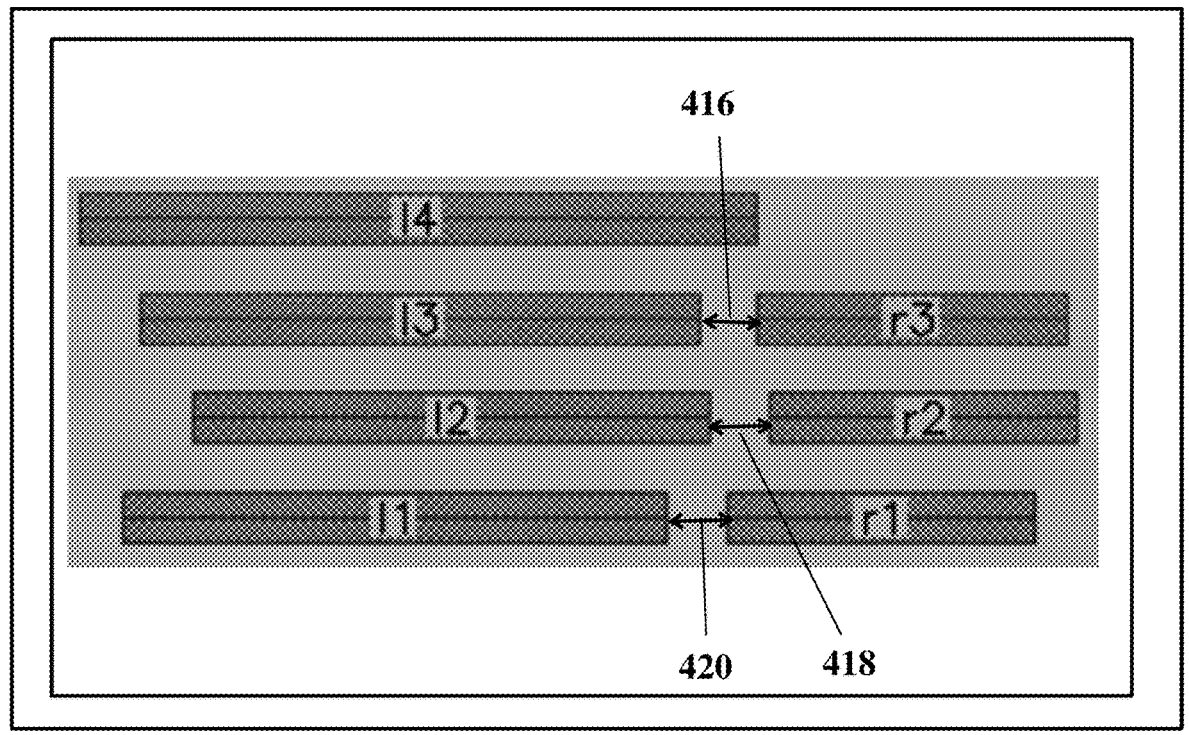

FIGS. 4A-4C show illustrative GUIs 400a-400c generated by a computer while aligning a first set of wires l1, l2, l3, l4 to a second set of wires r1, r2, r3. In particular, the GUIs 400a-400c display an illustrative process of aligning the first set of wires l1, l2, l3, l4 to the second set of wires r1, r2, r3 with fewer wires. It should be understood that the GUIs 400a-400c and the steps of alignment process displayed thereon are merely for illustration and ease of explanation and should not be considered limiting. Other type of GUIs and other alignment processes should also be considered within the scope of this disclosure.

The computer may generate the GUI 400a displaying a first set of wires l1, l2, l3, l4 to be aligned with a second set of wires r1, r2, r3. The first set of wires l1, l2, l3, l4 may form a selection set, which the computer may have to move or stretch. The computer therefore may have to identify a reference edge or point on each of the first set of wires l1, l2, l3, l4. The GUI 400a may be based upon an alignment command provided by a circuit designer to the computer. The alignment command may be through a command line interface displayed by the computer or through a selection of a graphical object (e.g., a button on a command pane). In response to the alignment command, the computer may select the references (e.g., an edge to be aligned) to each of the first set of wires l1, l2, l3, l4. The computer may select the references based upon the direction of alignment, e.g., towards one or more corresponding targets. As shown, the computer may select reference 402 for wire l4, reference 404 for wire l3, reference 406 for wire l2, and reference 408 for wire l1. In addition, the computer may select targets (e.g., an edge to be aligned) for each wire in the second set of wires r1, r2, r3. The computer may select the targets based upon the direction of the alignment, e.g., towards the direction of corresponding references 402, 404, 406, 408. As shown, the computer may select target 410 on wire r3 for reference 402 on wire l4, target 410 on wire r3 for reference 404 on wire l3, target 412 on wire r2 for reference 406 on wire l2, target 414 on wire r1 for reference 408 on wire l1. For wire l4, there is no corresponding wire to be aligned. Therefore, the computer may select the target 410 on wire r3 for the reference 402 in wire l4. In some instances, the computer may display each of the reference target pairs 402:410, 404:410, 406:412, 408:414 as color coded pairs for easier identification by the circuit designer. As described below further, the circuit designer may override the computer made selection of one or more of the references 402, 404, 406, 408.

As shown, the references 402, 404, 406, 408 may be points or edges of each of the corresponding wires l1, l2, l3, l4. However, it should be understood that a reference for a wire may be point or an edge on another wire. The computer may generally provide the flexibility of selection of reference in the object (e.g., wire) itself or in another object. The computer sets as a reference an already selected aspect (point/edge) of an object. For example, if the aspect 402 (point/edge of the wire l4 on the right side of the wire l4) has already been selected (e.g., for other purposes in the circuit design/simulation process), the computer may select the aspect 402 to set a reference for the wire l4. In other instances, the user may explicitly select the aspect 402 to set a reference for the wire l4. For example, the user may click on the aspect 402 or provide a command line instruction to the computer to select the aspect 402 to set a reference for the wire l4 as a part of the alignment request/command.

In some instances, the user may have selected the entire wire l4 thereby making either edges (or points within the edges) 402, 422 as candidates for a reference for the wire l4. In these instances, the computer may select as a reference the edge matching an identified target. Therefore, for the wire l4, the computer may select as a reference the edge 402 (out of the set containing edges 402, 422) because the edge 402 matches the identified target 410. The computer may determine the matching based upon one or more algorithms associated with the alignment command.

In some cases, a wire is fully selected and the computer may have to identify a reference on the fully selected wire. The fully selected wire may have multiple aspects and, therefore, multiple candidates for a reference. The computer may use an algorithm associated with the alignment command to identify a reference from the multiple candidates. For example, the computer may select as a reference the edge that is closest to the mouse cursor in the GUI 400a. If there are multiple edges at roughly the same distance from the mouse cursor, the computer may select the most important edge based upon path characteristics. Path characteristics for a wire may define a width for a wire and/or a movement or stretch direction of the wire. For instance, based upon the path characteristics, each of the wires l1, l2, l3, l4, r1, r2, r3 may have a fixed width and may be able to stretch or move in one direction lengthwise. As a non-limiting example, the wire l4 may only stretch horizontally towards r3 and therefore aspect 402 may be the most important aspect for the wire l4. The computer may display the computer selected references (e.g., references 402, 404, 406, 408) and the user may provide override commands to select references other than the computer selected references. For example, the user may cycle through other aspects and pick one or more of the other aspects as references.

In some embodiments, the user may have selected multiple objects, e.g., all of the wires l1, l2, l3, l4, and the computer may have to identify references for each of the wires l1, l2, l3, l4. The computer may identify targets 410, 412, 414 for each of the wires l1, l2, l3, l4 utilizing an algorithm associated with the alignment command and identify (or select) the references 402, 404, 406, 408 based upon the identified targets. For example, the computer may select an aspect for a wire (out of the multiple selected wires) that is closest to the mouse cursor. For example, aspect 402 of the wire l4 may be closest to the mouse cursor and the computer select aspect 402 as a reference 402 for wire l4. If there are multiple candidates, e.g., multiple aspects being roughly the same distant from the mouse cursor, the computer may select the most important aspect. For example, aspect 402 may be the most important aspect based on the characteristics of the wire l4. Regardless of the modality of selection, once the computer sets the first reference 402, the computer may determine and set the rest of references by aspects of other wires l3, l2, l1 that are parallel or in the same direction as the first reference 402. As shown in FIG. 4A, the computer may set as respective references aspects 404, 406, 408 for the wires l3, l2, l1 as these aspects 404, 406, 408 are in the same direction as the first reference 402.

The computer may display the computer selected references 402, 404, 406, 408 and allow the user to override one or more of the computer selected references 402, 404, 406, 408. The user can select other references by cycling to other aspects (e.g., aspect 422 in the wire l4). If the user selects a non-computer selected aspect as a reference, e.g., by selecting aspect 422 overriding the computer selected aspect 402, the computer may adjust other references 404, 406, 408 based upon the user's selection of the new reference 426. In some embodiments, the computer may allow the user to override all the selected references 402, 404, 406, 408 and keep one of the references as a single primary reference. Regardless of the modality of selection, the selected references 402, 404, 406, 408 (or any other set of references or a single primary reference) may determine how the set of wires l1, l2, l3, l4 may move, stretch, or copy for alignment.

In addition, the computer may select targets (e.g., for references 402, 304, 306, 308) for each wire in the second set of wires r1, r2, r3. The computer may select the targets based upon the direction of the alignment, e.g., towards the direction of corresponding references 402, 404, 406, 408. As shown, the computer may select target 410 on wire r3 for reference 402 on wire l4, target 410 on wire r3 for reference 404 on wire l3, target 412 on wire r2 for reference 406 on wire l2, target 414 on wire r1 for reference 408 on wire l1. In some instances, the computer may display each of the reference target pairs 402:410, 404:410, 406:412, 408:414 as color coded pairs for easier identification by the circuit designer.

In some instances, the computer may identify and select a target 410 before identifying and selecting the references 402, 404, 406, 408. The number of eventually selected targets 410, 412, 414 can be the lower than the number of eventually selected references 402, 404, 406, 408 (as described herein with regard to FIGS. 4A-4C) or same as the number of references (as described above in regard to FIGS. 3A-3C). For a single target identification and selection (e.g., target 410), the computer may identify a target with a closest aspect (e.g., edge 410 of the wire r3) from the mouse pointer. The selected target may have a maximum span for the dimensions of other selected objects, e.g., the wires l1, l2, l3, l4 that may have to be stretched, copied, or moved towards the selected target. Furthermore, the computer may select the target on the closest layer purpose pair (LPP) stack, such as the same LPP stack as that of the selected objects that may have to be stretched, copied, or moved towards the selected target. The computer may then display the selected target and the inferred references (based upon a previous selection of the objects) and show a drag preview. Additionally or alternatively, the computer may identify and select pairs of references and targets. For example, the computer may select as a target closest aspect to the mouse pointer that has one of the selections identified as a reference (also referred to as an inferred reference). For instance, the target may be on the same line or within a span in a direction perpendicular to an alignment line from the inferred reference. As another example, the target may be at the closest LPP or the same LPP in the connectivity stack as the inferred reference. The computer may highlight (e.g., through color coding) the identified target and the inferred reference as primary reference-target pair. The computer may then identify other targets matching other selections (e.g., other inferred references) using similar logic. After identifying and selecting the targets for the inferred references, the computer my highlight the reference-target pairs and may display drag or stretch previews. The computer may allow the circuit designer to modify or approve one or more of the highlighted reference-target pairs.

In other instances, the computer may identify and select the targets 410, 412, 414 after identifying and selecting the references 402, 404, 406, 408. For a single target identification and selection, the computer may identify a target that is closest to the mouse pointer and is compatible with the primary reference or any other reference (e.g., reference 302). The identified target may have a maximum span for the dimensions of all the selected wires (e.g., l1, l2, l3, l4) or aspects (e.g., 402, 404, 406, 408). The selected target may have to be on the closest LPP or the same LPP in the connectivity stack as the primary reference or any other reference. After identifying and selecting the target, the computer may highlight the target and may display a drag or stretch preview. The circuit designer may override or approve the computer selected target. Additionally or alternatively, the computer may identify and select pairs of references and targets. For example, the computer may select as a target closest aspect to the mouse pointer that may be compatible with a known primary reference. For instance, the target may be on the same line or within a span in a direction perpendicular to an alignment line from the known primary reference. As another example, the target may be at the closest LPP or the same LPP in the connectivity stack as the known primary reference. The computer may highlight (e.g., through color coding) the identified target and the primary reference as primary reference-target pair. The computer may then identify other targets matching other references using similar logic. After identifying and selecting the targets for the known references, the computer may highlight the reference-target pairs and may display drag or stretch previews. The computer may allow the circuit designer to modify or approve one or more of the highlighted reference-target pairs.

Based upon the selected references 402, 404, 406, 408 and the selected targets 410, 412, 414 the computer may generate an updated GUI 400b. The updated GUI displays an alignment process wherein: (i) wire l4 may stretch from reference 402 towards the target 410 on the wire r3, (ii) wire l3 may stretch from reference 404 towards the target 410 on the wire r3, (iii) wire l2 may stretch from reference 406 towards the target 412 in the wire r2, and (iv) wire l1 may stretch from reference 408 towards the target 414 in the wire r1. The computer may stretch each of the wires l1, l2, l3, l4 based upon a calculated distance (by the computer) between the corresponding references and targets. More specifically, the computer may: (i) stretch wire l4 based upon a calculated distance between reference 402 and the target 410, (ii) stretch wire l3 based upon a calculated distance between reference 404 and the target 410, (iii) stretch wire l2 based upon a calculated distance between reference 406 and the target 412, and (iv) stretch wire l1 based upon a calculated distance between 408 and the target 414. In some instances, the computer may carry over the color coding displayed in GUI 400a to the updated GUI 400b. It should be understood that the stretching of the wires l1, l2, l3, l4 is merely for illustration and any kind of movement towards the corresponding references 410, 412, 414 should be considered within the scope of this disclosure.

The computer may generate an updated GUI 400c as shown in FIG. 4C when the aforementioned alignments are committed by the computer and/or the circuit designer. To commit the alignments, the circuit designer may provide a commit command, e.g., through command line or through a graphical object, and the computer may commit the alignments in response to the commit commands. In some instances, the computer may commit the alignments as a part of executing the align command. Regardless of the modality of receiving the commit command, the computer may generate a final alignment between the wire pairs l1:r1, l2:r2, l3:r3, l4:r3 with minimum spacing between each of these wire pairs except for l4:r3. As shown in the updated GUI 400c, wire pair l3:r3 may have a minimum spacing 416, wire pair l2:r2 may have a minimum spacing 418, and wire pair l1:r1 may have a minimum spacing 420. As l4 does not have a corresponding wire on the right, l4 aligns to r3, and therefore such alignment may not have to obey minimum spacing rules. Furthermore, the minimum spacing rule to maintain each minimum spacing 416, 418, 420 is merely illustrative and other minimum spacing rules should be considered within the scope of this disclosure. In some embodiments, there may be no spacing (e.g., minimum spacing=0) or a user defined spacing.

As shown in the updated GUI 400c, the computer may utilize the embodiments disclosed herein to generate a correct alignment between each of the wire pairs l1:r1, l2:r2, l3:r3, l4:r3 while obeying the minimum spacing rules for each of the wire pairs l1:r1, l2:r2, l3:r3. Unlike the conventional tools, there may not be a short or an incorrect spacing between each of the wire pairs l1:r1, l2:r2, l3:r3. As described above, because l4 aligns to r3, which are not co-linear, the alignment of the wire pairs l4:r3 may not have to obey minimum spacing (or any other spacing) rules.

Figure 5:
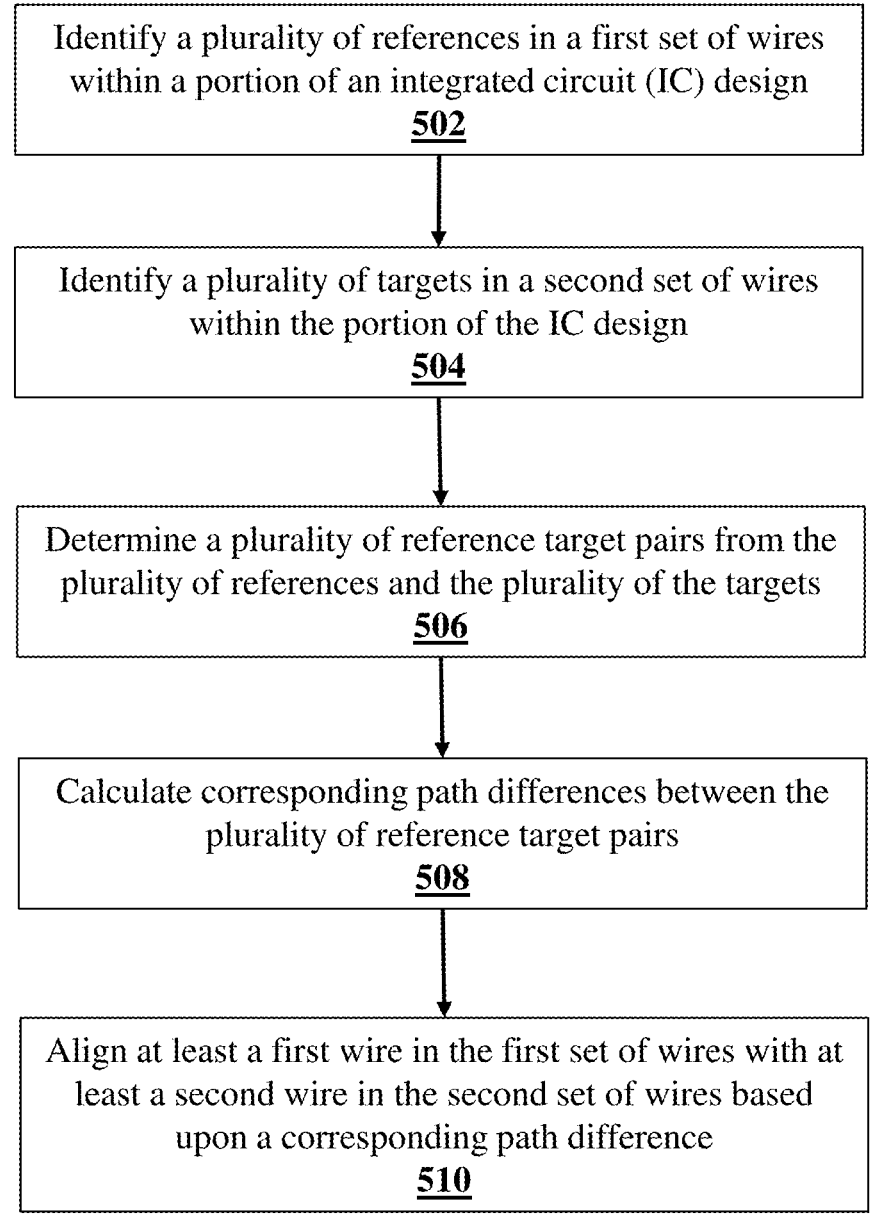
FIG. 5 shows a flow diagram of an illustrative method of aligning a first set of wires with a second set of wires while obeying minimum spacing rules, according to an embodiment.

FIG. 5 shows a flow diagram of an illustrative method 500 of aligning wires in an IC design, according to an embodiment. It should be understood that the steps of the method 500 as shown in FIG. 5 and described herein are merely illustrative and alternate, additional, and a fewer number of steps should be considered within the scope of this disclosure. Although multiple computers can execute one or more steps of the method, the following describes a single computer executing all of the steps of the method. It should further be understood that the sequence of the steps is merely illustrative and the computer may execute the steps in any sequence.

The method 500 may begin at step 502 where the computer may identify a plurality of references in a first set of wires within a portion of the IC design. The references may be edges or points on the edges in the first set of wires. In some embodiments, the computer may identify a primary reference and then identify other references based upon the primary reference. The computer may further allow a circuit designer to override or modify by the computer identified and selected references.

At a next step 504, the computer may identify a plurality of targets in a second set of wires within the portion of the IC design. The targets may be edges or points on the edges in the second set of wires. The computer may first identify a primary target and then identify other targets based upon the primary target, e.g., after references have been identified. In some embodiments, the computer may first identify the plurality of targets and inferentially identify corresponding plurality of the references in the first set of wires. In other embodiments, the computer may identify the plurality of targets for the plurality of references that are already known. The computer may further allow the circuit designer to override or modify by the computer identified and selected targets.

At a next step 506, the computer may determine a plurality of reference target pairs from the plurality of references and the plurality of targets. In some embodiments, the computer may first determine a primary reference target pair based upon the compatibility (e.g., stretch or move direction) and identify other reference target pairs based upon the primary reference target pair. The computer may further allow the circuit designer to override or modify the computer determined reference target pairs.

At a next step 508, the computer may calculate corresponding path differences between the plurality of reference target pairs. The path differences may be the distance between the targets and the corresponding references. In some embodiments, the path differences may account for predetermined or user defined minimum spacing between the corresponding wires.

At a next step 510, the computer may align at least a first wire in the first set of wires with at least a second wire in the second set of wires based upon a corresponding path difference. For the alignment, the computer may move or stretch the first wire towards the target in the second wire. The computer may align the first wire with the second wire such that there is a predetermined or a user defined minimum spacing between the wires. Alternatively, the computer may align the first and the second wires with no spacing between the wires.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A computer-implemented method comprising:
   identifying, by a computer, a plurality of references in a first set of wires within a portion of an integrated circuit (IC) design based upon a user input indicating a portion of the first set of wires;
   identifying, by the computer, a plurality of targets in a second set of wires within the portion of the IC design;
   determining, by the computer, a plurality of reference target pairs from the plurality of references and the plurality of the targets;
   calculating, by the computer, corresponding path differences between the plurality of reference target pairs; and
   aligning, by the computer, at least a first wire in the first set of wires with at least a second wire in the second set of wires based upon a corresponding path difference.

2. The computer-implemented method of claim 1, wherein aligning the first wire with the second wire further comprises:
   stretching, by the computer, the first wire towards the direction of the second wire.

3. The computer-implemented method of claim 1, wherein aligning the first wire with the second wire further comprises:
   moving, by the computer, the first wire towards the direction of the second wire.

4. The computer-implemented method of claim 1, wherein aligning the first wire with the second wire further comprises:
  aligning, by the computer, the first wire and the second wire such that there is a predetermined minimum spacing between the first wire and the second wire.

5. The computer-implemented method of claim 1, wherein aligning the first wire with the second wire further comprises:
  aligning, by the computer, the first wire and the second wire such that there is no spacing between the first wire and the second wire.

6. The computer-implemented method of claim 1, wherein aligning the first wire with the second wire further comprises:
  aligning, by the computer, the first wire and the second wire such that there is a user defined spacing between the first wire and the second wire.

7. The computer-implemented method of claim 1, further comprising:
  identifying, by the computer, the plurality of references in the first set of wires prior to identifying the plurality of targets in the second set of wires.

8. The computer-implemented method of claim 1, further comprising:
  identifying, by a computer, the plurality of targets in the second set of wires prior to identifying the plurality of references in the first set of wires.

9. The computer-implemented method of claim 1, further comprising:
  modifying, by the computer, at least one reference target pair in response to a modification instruction from a user.

10. The computer-implemented method of claim 1, wherein each of the plurality of references is an edge or a point on the edge of a corresponding wire in the first set of wires and wherein each of the plurality of targets is an edge or a point on the edge of the corresponding wire in the second set of wires.

11. A system for aligning wires in an integrated circuit design, the system comprising:
  one or more computers comprising a non-transitory machine-readable media configured to store a database records of first set of wires and a second set of wires forming a portion of an integrated circuit (IC) design;
  at least one computer of the one or more computers, the at least one computer electrically coupled to the non-transitory machine-readable media and comprising a processor configured to:
    identify a plurality of references in the first set of wires based upon a user input indicating a portion of the first set of wires;
    identify a plurality of targets in the second set of wires;
    determine a plurality of reference target pairs from the plurality of references and the plurality of the targets;
    calculate corresponding path differences between the plurality of reference target pairs; and
    align at least a first wire in the first set of wires with at least a second wire in the second set of wires based upon a corresponding path difference.

12. The system of claim 11, wherein to align the first wire with the second wire, the processor is further configured to:
  stretch the first wire towards the direction of the second wire.

13. The system of claim 11, wherein to align the first wire with the second wire, the processor is further configured to:
  move the first wire towards the direction of the second wire.

14. The system of claim 11, wherein to aligning the first wire with the second wire, the processor is further configured to:
  align the first wire and the second wire such that there is a predetermined minimum spacing between the first wire and the second wire.

15. The system of claim 11, wherein to align the first wire with the second wire, the processor is further configured to:
  align the first wire and the second wire such that there is no spacing between the first wire and the second wire.

16. The system of claim 11, wherein to align the first wire with the second wire, the processor is further configured to:
  align the first wire and the second wire such that there is a user defined spacing between the first wire and the second wire.

17. The system of claim 11, wherein the processor is further configured to:
  identify the plurality of references in the first set of wires prior to identifying the plurality of targets in the second set of wires.

18. The system of claim 11, wherein the processor is further configured to:
  identify the plurality of targets in the second set of wires prior to identifying the plurality of references in the first set of wires.

19. The system of claim 11, wherein each of the plurality of references is an edge or a point on the edge of a corresponding wire in the first set of wires and wherein each of the plurality of targets is an edge or a point on the edge of the corresponding wire in the second set of wires.

20. A computer readable non-transitory medium containing one or more computer instructions, which when executed by a processor cause the processor to:
  identify a plurality of references in a first set of wires within a portion of an integrated circuit (IC) design based upon a user input indicating a portion of the first set of wires;
  identify a plurality of targets in a second set of wires within the portion of the IC design;
  determine a plurality of reference target pairs from the plurality of references and the plurality of the targets;
  calculate corresponding path differences between the plurality of reference target pairs; and
  align at least a first wire in the first set of wires with at least a second wire in the second set of wires based upon a corresponding path difference.

* * * * *